US010146888B2

(12) United States Patent
Barnes et al.

(10) Patent No.: US 10,146,888 B2
(45) Date of Patent: Dec. 4, 2018

(54) SYSTEMS AND METHODS FOR CRITERIA ANALYSIS PROTOTYPING

(75) Inventors: William Justin Barnes, Oklahoma City, OK (US); Adric Carlyle Eckstein, Sterling, VA (US); Michael John Mills, Alexandria, VA (US); Christopher Michael Wynnyk, Washington, DC (US)

(73) Assignee: The MITRE Corporation, McLean, VA (US)

( * ) Notice: Subject to any disclaimer, the term of this patent is extended or adjusted under 35 U.S.C. 154(b) by 936 days.

(21) Appl. No.: 13/432,615

(22) Filed: Mar. 28, 2012

(65) Prior Publication Data

US 2013/0262039 A1    Oct. 3, 2013

(51) Int. Cl.
*G06F 7/60* (2006.01)
*G06G 7/48* (2006.01)
*G06F 17/50* (2006.01)

(52) U.S. Cl.
CPC .................................. *G06F 17/50* (2013.01)

(58) Field of Classification Search
None
See application file for complete search history.

(56) References Cited

U.S. PATENT DOCUMENTS

| 5,247,666 | A  | * | 9/1993 | Buckwold |
| 6,751,622 | B1 | * | 6/2004 | Puri et al. |
| 2006/0167601 | A1 | * | 7/2006 | Henning et al. ................. 701/30 |
| 2012/0053832 | A1 | * | 3/2012 | Irish et al. ..................... 701/448 |
| 2013/0110388 | A1 | * | 5/2013 | Becher et al. ................. 701/120 |

OTHER PUBLICATIONS

Identifying the Achilles Heels of Instrument Flight Procedures International Flight Inspection Symposium Oklahoma City, OK USA. Jun. 2008. Ivan Ferencz. CAA Slovakia.*

* cited by examiner

*Primary Examiner* — Aniss Chad
*Assistant Examiner* — Nithya J. Moll
(74) *Attorney, Agent, or Firm* — Sterne, Kessler, Goldstein & Fox P.L.L.C.

(57) ABSTRACT

A flight procedure criteria prototyping system and method is described herein. According to embodiments, the system is configured to generate a prototype, generate a dependency tree based on the prototype, wherein the dependency tree is comprised of one or more dependency tree nodes, translate the dependency tree into one or more construction steps, wherein there is a mapping between the one or more dependency tree nodes and the one or more construction steps, maintain an ordered list of the one or more construction steps, and generate one or more software specifications based on the one or more construction steps.

23 Claims, 8 Drawing Sheets

SYSTEMS AND METHODS FOR CRITERIA ANALYSIS PROTOTYPING

BACKGROUND OF THE INVENTION

Field of the Invention

The present invention relates generally to designing and testing new instrument flight procedure criteria.

Background Art

The Federal Aviation Administration (FAA) develops and publishes criteria for Terminal Instrument Procedures (TERPS). These criteria provide guidance for instrument procedure design, setting requirements for parameters such as minimum leg length, required turn radius, and allowable leg combinations. Criteria also include high precision methods for evaluating obstacle clearances in regions surrounding the flight path. These rules ensure that new flight procedures are safe, flyable, and efficient.

Modern aircraft are now capable of high precision navigation. These improved capabilities have motivated the design of new and more comprehensive criteria. Criteria prototyping provides a valuable means of testing and evaluating the impact of new criteria changes, before they are published. Additionally, it ensures the criteria developed can be implemented in automated design software without altering its original intent. This improves the quality of new criteria and reduces costly future redesign. Accordingly, there is a need for a method, system, and computer program product that facilitates criteria development while reducing the complexity of the FAA's workload and allowing for a rapid and more intuitive design phase.

BRIEF SUMMARY OF THE INVENTION

Embodiments include a flight procedure criteria prototyping system, method and computer program product. The system can be used for rapid criteria prototyping, which allows for the automation of testing and analysis of flight procedure criteria. According to an embodiment, the system is configured to generate a prototype, generate a dependency tree based on the prototype, wherein the dependency tree is comprised of one or more dependency tree nodes, maintain a dependency relationship between the dependency tree nodes, translate the dependency tree into one or more construction steps, wherein there is a mapping between the dependency tree nodes and the construction steps, and generate one or more software specifications based on the construction steps.

In an embodiment, a method for constructing flight procedure criteria includes generating a prototype, generating a dependency tree based on the prototype, wherein the dependency tree is comprised of one or more dependency tree nodes, maintaining a dependency relationship between the dependency tree nodes, translating the dependency tree into one or more construction steps, wherein there is a mapping between the dependency tree nodes and the construction steps, and generating one or more software specifications based on the construction steps.

In an embodiment, a method of using a computer-aided design tool to create and validate instrument flight procedure criteria includes generating a prototype of the flight procedure criteria, evaluating the prototype of the flight procedure criteria based on a user action, identifying failures in the prototype, and generating a specification based on the prototype.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

Overview

An instrument approach procedure (IAP) is a series of predetermined maneuvers for the orderly transfer of an aircraft under instrument flight conditions (IFC) from the beginning of the initial approach to a landing, or to a point from which a landing may be made visually. Flight procedure criteria are a set of guidelines for developing new instrument procedures. The FAA develops and publishes criteria to ensure that new instrument procedures are safe, able to be flown, and meet operational requirements.

Developing new criteria is a challenging process. Separate criteria guidelines are required for each phase of flight, including arrivals, departures, and missed approach sequences. Additionally, criteria are dependent on aircraft class and navigation precision. Criteria design considerations include safety, operational impact, algorithmic complexity, flyability, and impact on existing procedures. Automation requirements place additional constraints on the design of new criteria. The objective is to provide software that can check whether new procedures meet criteria guidelines. Criteria must be designed such that the rules can reasonably be expressed in software.

The invention provides a visual means of prototyping new criteria guidelines. This approach enables a rapid-iteration design process, in which new criteria can be quickly implemented and evaluated against criteria design considerations. The resulting prototype automatically generates a set of explicit instructions and corresponding diagrams for implementing the criteria guideline in software. The invention streamlines the criteria development process, ensuring that criteria meet the intent of the authors and improving the ability of the designer to visualize all the scenarios to which the criteria could be applied.

Example System Embodiments

Figure 1:
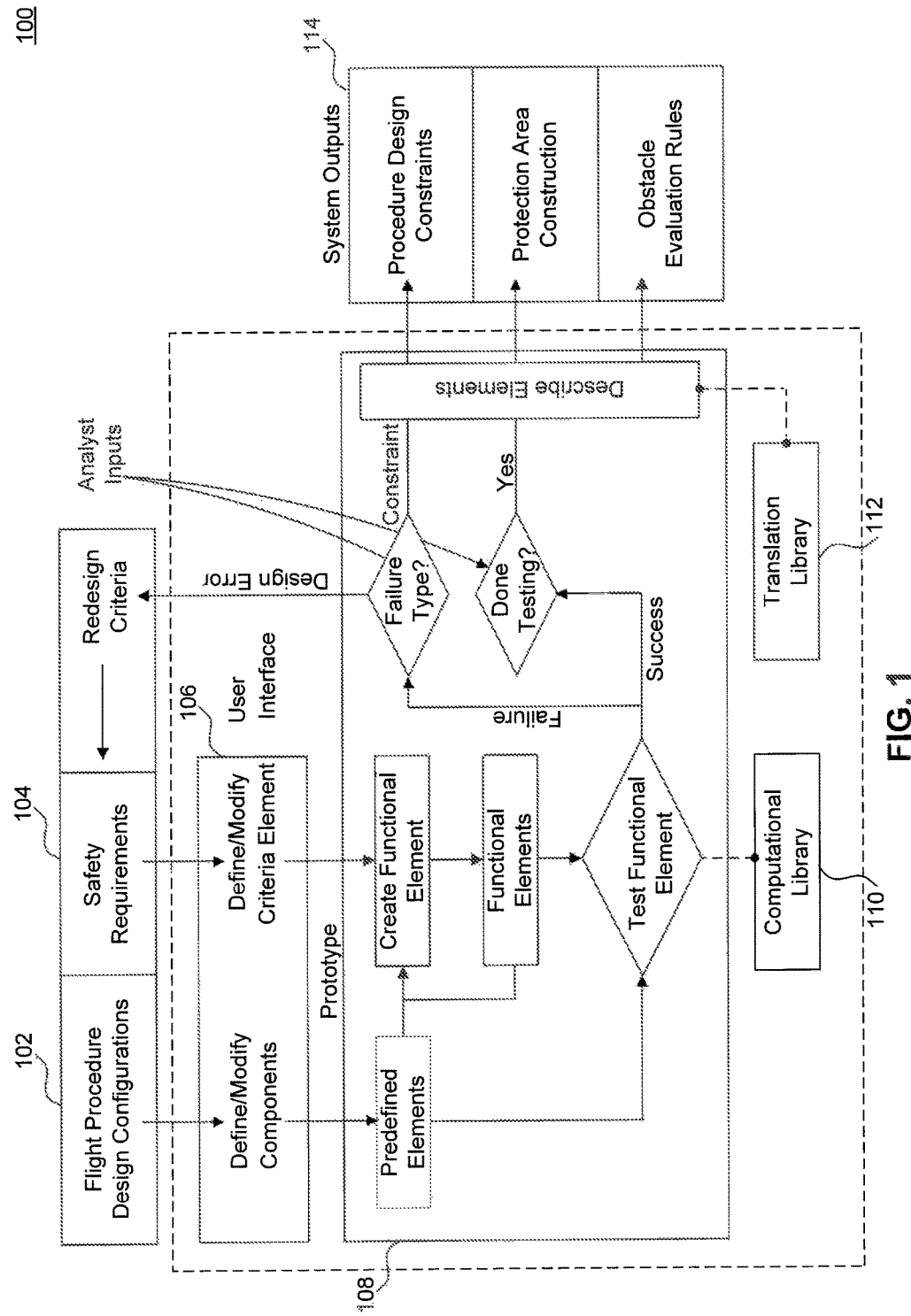
FIG. 1 is a block diagram of an example system for constructing flight procedure criteria, according to an embodiment of the present invention.

FIG. 1 is a block diagram 100 of an example system for constructing flight procedure criteria according to an embodiment of the present invention. Example system 100 can be implemented in software, hardware, or a combination of software and hardware. Example system 100 may implement a variety of methods, computational algorithms, and heuristics, further described below, according to embodiments of the present invention.

As shown in FIG. 1, example system 100 includes a user interface 106 configured to receive flight procedure design configurations 102 and safety requirements 104. Example system 100 generates system outputs 114 which include procedure design constraints, protection area construction, and obstacle evaluation rules.

According to embodiments, flight procedure design configurations 102 facilitate the identification of a plurality of predefined elements. Upon the receipt of flight procedure design configurations 102 by a user interface, one or more predefined elements may be identified and made available for user interaction based on flight procedure design configurations 102. The predefined elements represent the root variables of flight procedure design configurations 102, such as fixes and turn angles. Each predefined element is independent of any other element within the one or more predefined elements identified by flight procedure design configurations 102. In an embodiment, the one or more predefined elements identified by flight procedure design configurations 102 may be dynamically modified via user interface 106. One or more flight procedure design configurations 102 may be stored in a database, according to an embodiment.

According to embodiments, the one or more predefined elements identified by flight procedure design configurations 102 provide a user with the capability to define and modify elements of a prototype 108 for flight procedure criteria. The predefined elements identified by flight procedure design configurations 102 may include numerical constants, geodetic points, geodesics, arcs, loci of points, spirals, and boundary objects. For example, geodetic points may represent a midpoint of an element, center of an arc, intersection of two elements, projection to an element or boundary, or the point closest to another point or element. Geodesics may represent, for example, the path between two points, the tangent to an arc at a point, the tangent to two arcs, the tangent to an arc and intersecting line segment at a known angle, a line segment bisected by another line segment with known half-length, or a line segment bisecting an angle formed by two other line segments with a shared point. In addition, arcs, loci of points, spirals, and boundary objects may represent their standard geometric definitions.

According to embodiments, the one or more predefined elements of flight procedure design configurations 102 interact through construction operators of user interface 106. Construction operators include operations such as modifications (i.e. extend line segment/locus, truncate element, move start/end point of element, etc.), course calculations (i.e. course from one point to another, at point on an element, course change from inbound line segment to outbound line segment, etc.), distance calculations (i.e. distance, between two points, of an element, width of locus, etc.), and conditional determinations (i.e. points are equal, point is left/right of line, point is inside arc, element contains point, element intersects, etc.).

According to embodiments, safety requirements 104 provide the framework for designing flight procedure criteria. Safety requirements 104 provide the requirements that must be satisfied in order to have valid flight procedure criteria. All requirements of safety requirements 104 must be satisfied in order to generate valid flight procedure criteria. Upon the receipt of safety requirements 104 by user interface 106, a user may define one or more criteria elements. The one or more criteria elements are defined by the user to help construct safety protection areas and evaluation of the flight procedure criteria. According to embodiments, criteria elements allow for operations such as "If this is a left turn, draw this line, else for a right turn, draw that line." Criteria elements interact with the predefined elements of flight procedure design configurations 102 and the construction operators to generate functional elements.

According to an embodiment, the one or more criteria elements interact with the predefined elements identified by flight procedure configurations 102 during the generation of a prototype 108 for flight procedure criteria. According to an embodiment, the one or more criteria elements are functionally defined so that they are dependent upon other elements. In an embodiment, the functional elements may be represented by a dependency tree having one or more dependency tree nodes. Further discussion of the dependency tree takes place below. According to an embodiment, each functional element has a functional definition based on a geodetic computational library 110. Geodetic computational library 110 includes a set of mathematical algorithms used in the analysis of flight procedure criteria. Additionally, geodetic computational library 110 may include functions that support conversion between geodetic and mapping coordinates.

Each functional element maintains a functional relationship between all of its dependent elements. Upon the addition or modification of a predefined element or the addition of a new functional element, all of the successive functional relationships are tested, validated and updated as required by safety requirements 104 and the functional relationships. According to an embodiment, in the event of an algorithmic failure of a flight procedure criteria, the user will be notified and decide if any of the elements require redesign or if the failure represents a procedure design constraint. For example, during the generation of a criteria prototype, a user may attempt to apply a functional element, such as "Find Tangent Point". In the scenario in which a tangent point does not exist as part of the prototype, the user will be notified of the error. According to another embodiment, if all elements are successfully updated, the user will continue adding elements until all safety requirements have been met and all possible procedure configurations have been tested.

According to an embodiment, the functional elements may be translated into literal construction steps upon passing a functional element test. The functional element test validates each element within the prototype of the flight procedure criteria to determine that all design and safety requirements have been satisfied. The literal construction steps provide the description of the functional element in words. According to an embodiment, the literal construction steps may be used to generate specifications for flight procedure criteria, which may be used in the design and development of flight procedures. The functional elements may be translated into literal construction steps via a translation library 112, according to an embodiment.

System outputs 114 include the criteria necessary to design and implement flight procedure rules. For example, system outputs 114 provide recommendations for instrument procedure design, setting guidelines for parameters such as minimum leg length, required turn radius, allowable leg combinations, along with protection area construction, obstacle evaluation, and obstacle clearance surface heights rules. Criteria also include precision methods for evaluating clearance heights along the flight path. These rules ensure that new flight procedures are safe, flyable, and efficient.

Figure 2:
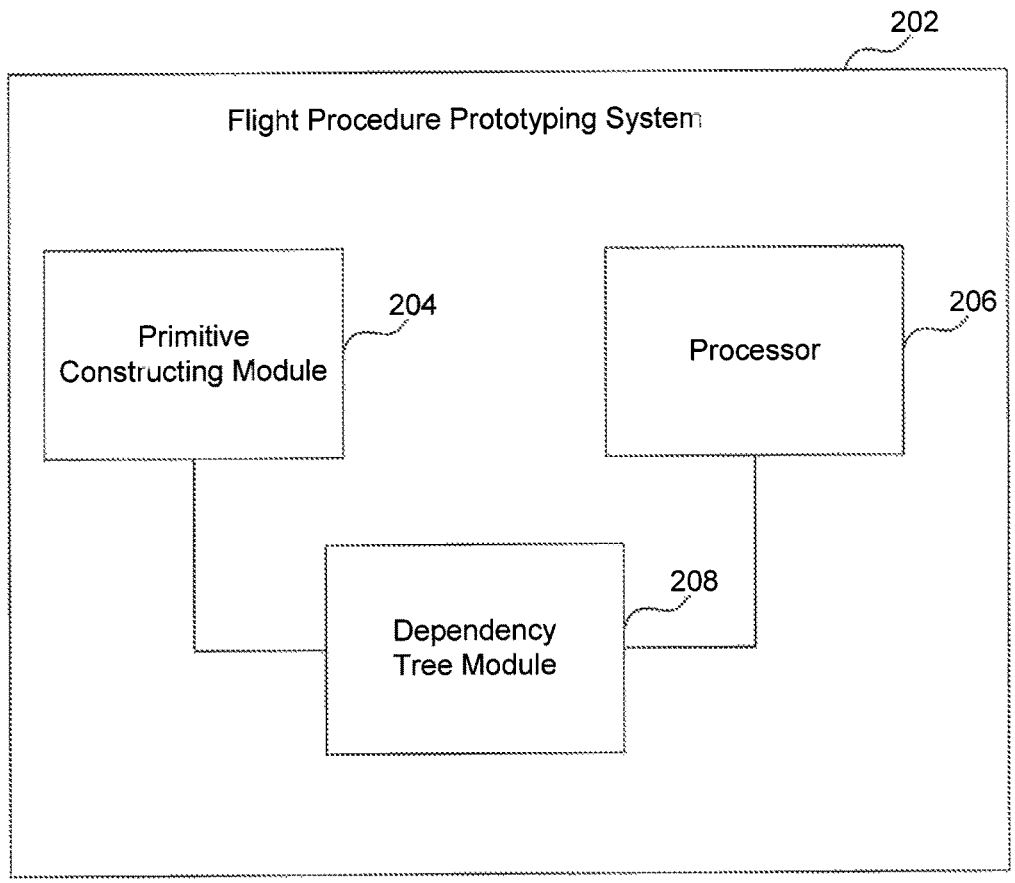
FIG. 2 illustrates an example system for constructing flight procedure criteria, according to an embodiment.

FIG. 2 illustrates an example system 202 for constructing flight procedure criteria according to an embodiment of the present invention. Example system 202 can be implemented in software, hardware, or a combination of software and hardware. Example system 202 may implement a variety of methods, computational algorithms, and heuristics, further described below according to embodiments of the present invention.

Figure 3:
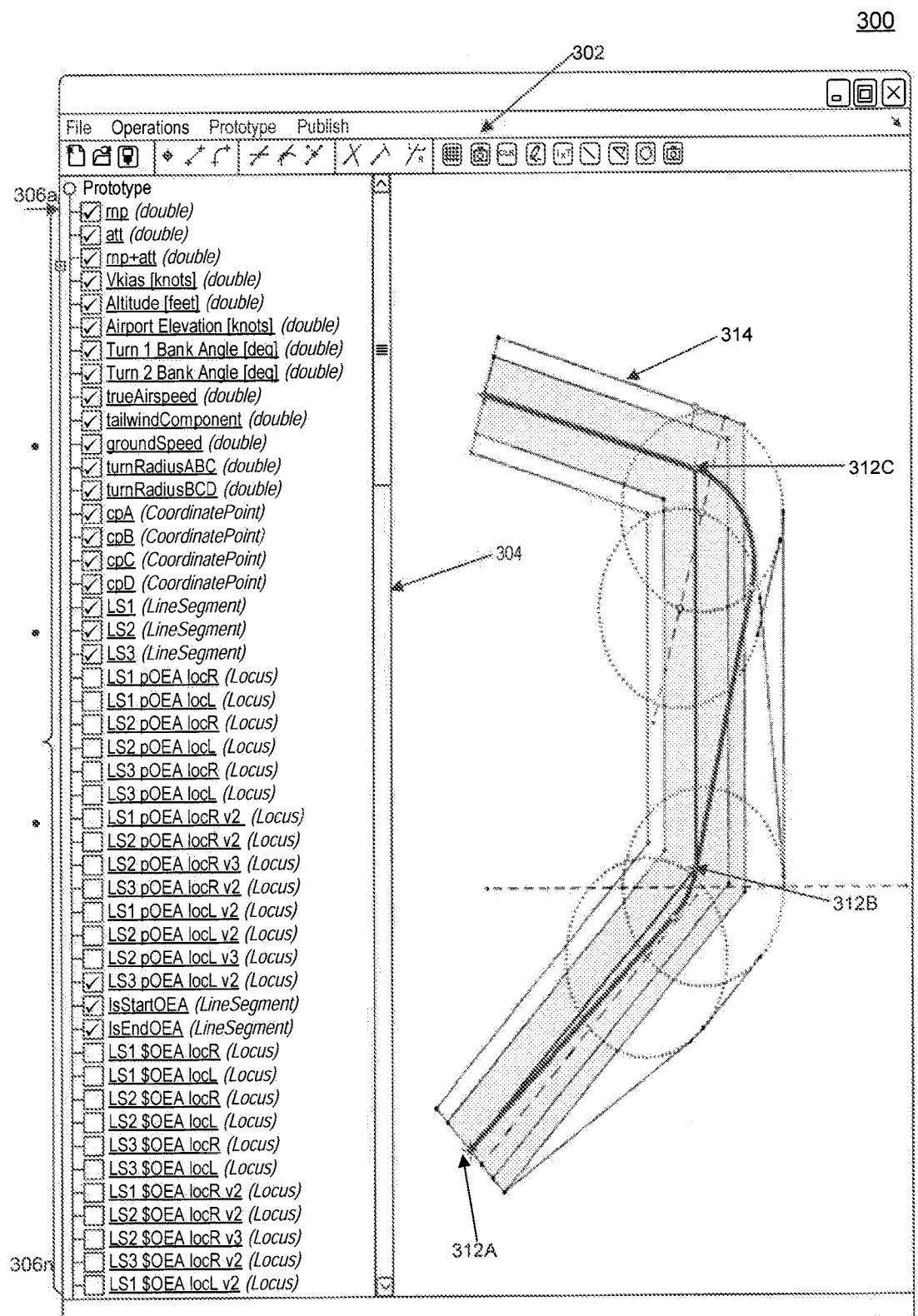
FIG. 3 illustrates an example screen shot of the flight procedure criteria tool, according to an embodiment.
Figure 4:
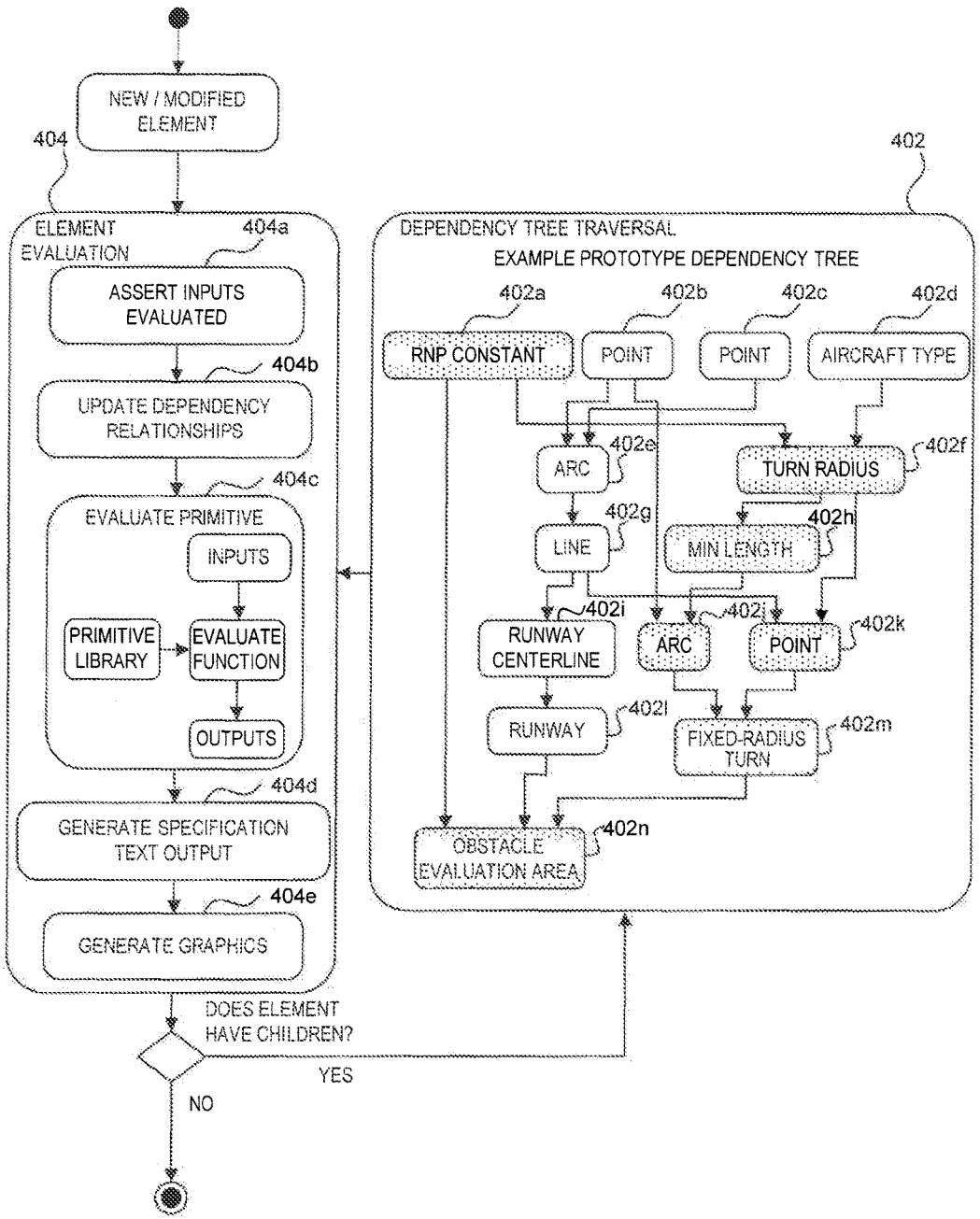
FIG. 4 illustrates an example dependency tree and element evaluation for constructing flight procedure criteria, according to an embodiment.

As shown in FIG. 2, flight procedure prototyping system 202 includes a primitive constructing module 204, a processor 206, and a dependency tree module 208. Flight procedure prototyping system 202 is configured to construct flight procedure criteria. For illustrative purposes, flight procedure prototyping system 202 will be described with reference to FIG. 3 and FIG. 4 to describe certain embodiments. FIG. 3 illustrates an example screen shot of the flight procedure criteria tool, according to an embodiment. FIG. 4 illustrates an example dependency tree and element evaluation for constructing flight procedure criteria, according to an embodiment.

FIG. 3 illustrates an example screen shot of the flight procedure criteria tool, according to an embodiment. According to embodiments, flight procedure design configurations 102 and safety requirements 104 along with user actions via user interface 106 may be combined to generate a prototype 300, as shown in FIG. 3. Prototype 300 is a visual representation of flight procedure criteria. For example, flight procedure design configurations 102 and safety requirements 104 along with user actions via user interface 106 may be combined to construct criteria for the design of leg length limitations, the nominal flight-path construction for a turn at a fix (fly-over or fly-by), or the obstacle evaluation region for a specific leg of a procedure. As illustrated in FIG. 3, prototype 300 is an example of a procedure with obstacle evaluation area 314. Such a procedure may include a number of waypoints or fixes 312A-312C, which may be given by their geographical coordinates.

According to an embodiment, upon generation of prototype 300, a construction hierarchical tree 306a-306n based on prototype 300 may be generated, wherein the construction hierarchical tree 306a-306n is comprised of one or more construction step nodes. The construction hierarchical tree 306a-306n provides a visual representation of each of the construction steps used to generate prototype 300. For example, as illustrated in FIG. 3, a scaled representation of the flight procedure showing the flight legs may be generated in a step by step process. In each step new elements of the prototype may be added or modified, which is represented by construction step nodes 306a-306n.

According to embodiments, primitive constructing module 204 is configured to generate a prototype 300, as shown in FIG. 3. In an embodiment, generating a prototype 300 includes generating a visual representation of the prototype based on one or more flight procedure design configurations, one or more safety requirements and a plurality of user actions and updating the visual representation dynamically based on these inputs. In an embodiment, the system may provide a point and click user interface for constructing flight procedure criteria prototypes. One or more primitive inputs may be combined to create a prototype. The primitive inputs may include geometric primitives, aviation primitives, logic primitives or user defined primitives. For example, the system may generate prototype 300 for a helicopter procedure. As discussed previously, a scaled representation of the flight procedure showing the flight legs may be generated in a step by step process. Each leg may be associated with a path terminator code, such as, but not limited to ARINC 424. Each leg may be terminated at a waypoint which may for example be fly-over, fly-by, or fixed-radius. The prototype may show the expected route of the helicopter along with the obstacle evaluation areas. The obstacle evaluation areas may include the obstacle clearance areas and surface heights that are used to identify the controlling obstacles, which in turn fix the minimum procedure altitudes, glide path angles and climb gradients.

As stated previously, FIG. 4 illustrates an example dependency tree and element evaluation for constructing flight procedure criteria, according to an embodiment. Dependency tree module 208 is configured to generate a dependency tree based on the prototype wherein the dependency tree is comprised of one or more dependency tree nodes. For example, dependency tree 402 of FIG. 4 may be generated based on a prototype. Dependency tree 402 may capture all of the elements of a prototype and the relationships between the elements. In an embodiment dependency tree 402 has one or more dependency tree nodes 402a-402n which may correspond to one or more construction steps of a generated prototype. For example each dependency tree node 402a-402n maintains a dependency relationship between other nodes within dependency tree 402. Each node may have a parent node and/or one or more descendant nodes according to an embodiment. For instance, FIG. 4 illustrates dependency tree 402 including parent node 402a. Parent node 402a has a plurality of dependent descendant nodes 402f, 402h, 402j, 402k, 402m, and 402n. According to an embodiment, upon a modification of parent node 402a, each of the dependent descendant nodes will be evaluated and updated accordingly. During an update, the dependency tree 402 may be traversed using a breadth-first traversal pattern, according to an embodiment. Element evaluation utilizing a breadth-first traversal pattern will successively evaluate each of the dependent descendant nodes 402f, 402h, 402j, 402k, 402m, and 402n. In an embodiment, dependency tree 402 has no cycles. Such a feature ensures that all inputs for an element are defined prior to evaluation of that element and minimizes re-evaluation of any elements.

According to an embodiment, each element and its dependencies of dependency tree 402 may be evaluated upon execution of a user action. For example, upon the addition, modification or movement of an element within prototype 300, the corresponding element and its dependencies may be evaluated and updated using element evaluation process 404. Evaluation process begins at step 404a, where one or more inputs for an element are evaluated. At step 404a, it is determined whether all of the inputs for the element are defined prior to evaluating the element. Upon verification of all the inputs for the element, element evaluation process 404 moves to step 404b. At step 404b, the dependency relationships of the element and existing dependent elements are updated. In an embodiment, dependency relationships of an element are updated when a user adds a new element to a prototype or modifies an existing element of a prototype. Evaluation process 404 proceeds to stop 404c, where the primitive is evaluated. At step 404c, a primitive element such as element 402a is evaluated based on the user action and the change to prototype 300. The evaluation of a primitive includes evaluating the primitive based on the inputs, and using a function library to produce an output. The output of each element will be the input to its dependent descendant nodes, according to an embodiment.

Evaluation process 404 proceeds to steps 404d and 404e, where the specification text is generated or updated and graphics are generated or updated respectively. After an element is evaluated, the specification text associated with that element may be generated or modified based on the evaluation. Furthermore, the graphical representation of the element is updated accordingly. Upon conclusion of the evaluation of an element, evaluation process 404 determines if the element has any dependent descendant nodes. If dependent descendant nodes exist, evaluation process 404 is repeated for each element, until the entire dependency tree 402 has been evaluated and updated. Once there are no more elements to be evaluated, evaluation process 404 is complete.

Returning to FIG. 2, according to embodiments, processor 206 is configured to translate a dependency tree into one or more construction steps. A construction step provides a breakdown of the flight procedure criteria and will provide a flight procedure designer or developer detailed instructions of the criteria that must be met during the design and implementation of flight procedures. According to an embodiment, each dependency tree node of dependency tree 402 will maintain a record of the input, output, and resultant action of each construction step. The dependency tree 402 may be traversed, while the record for each dependency tree node 402a-402n is translated into one or more instruction steps which describe the flight procedure criteria. In an embodiment, based on the construction steps, one or more software specifications may be generated. The one or more software specifications will provide a comprehensive description of the intended purpose and environment for development of the flight procedure criteria. In an embodiment, the generated software specifications may be exported from flight procedure prototyping system 202 to another system, such as a text editor application for viewing or modifying. In another embodiment, one or more figures for each of the instruction steps may be generated, wherein the one or more figures show one or more inputs and the one or more outputs for each of the instructions steps. For example, each instruction step of the flight procedure criteria will be represented by a generation of its visual counterpart, which will show a scaled version of the flight procedure criteria.

Figure 6:
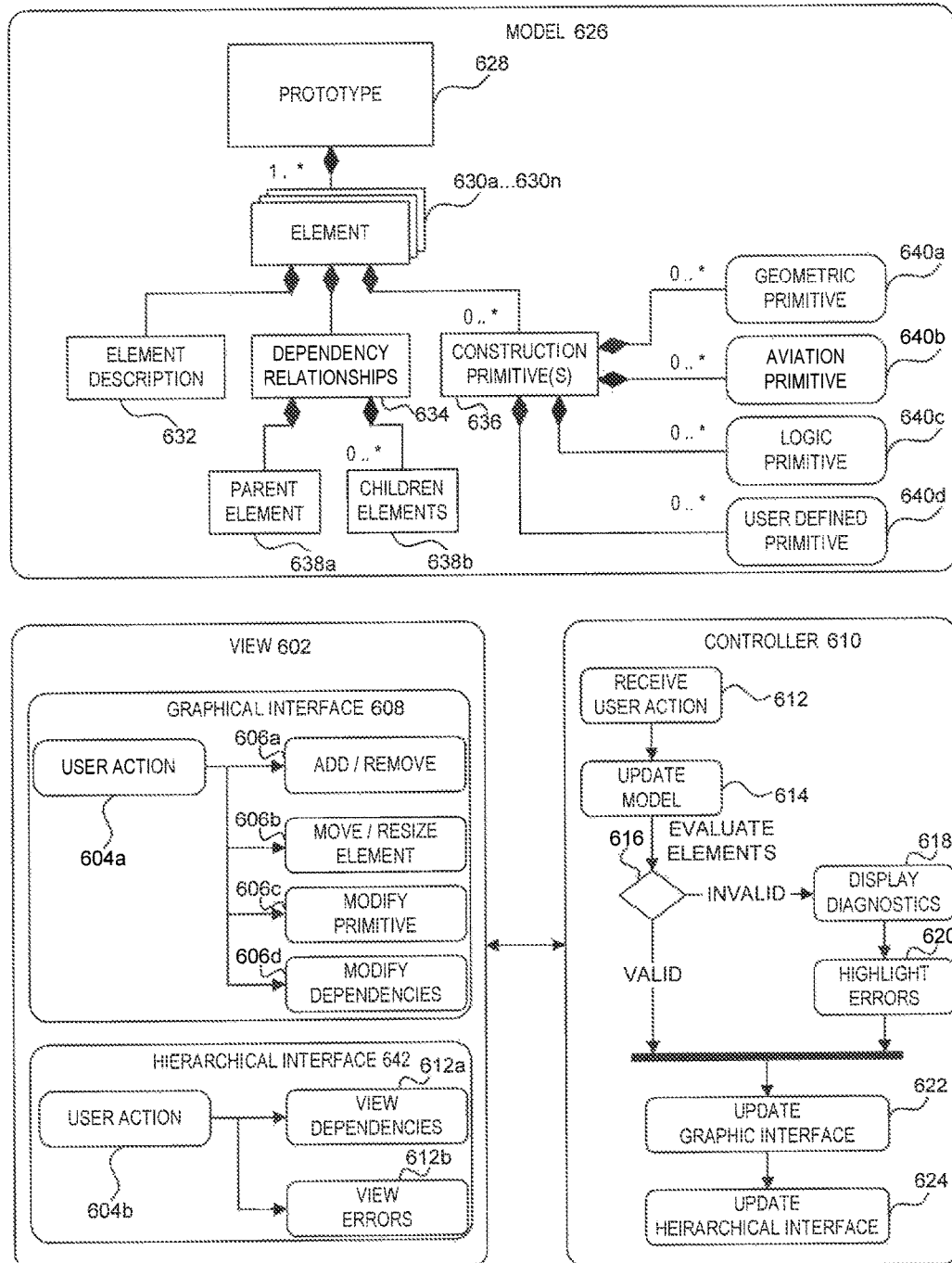
FIG. 6 is a system structure diagram for constructing flight procedure criteria, according to an embodiment.

FIG. 6 illustrates a model-view-controller pattern 600 of an example system for constructing flight procedure criteria according to an embodiment of the present invention. Model-view-controller pattern 600 includes model 626, view 602, and controller 610.

According to an embodiment, view 602 includes graphical interface 608 and hierarchical interface 642. View 602 enables a user to generate and modify a prototype according to an embodiment.

Graphical interface 608 provides a plurality of user actions 604a, which enable a user to generate and modify construction steps of a prototype. According to an embodiment, user actions 604a may include add/remove element functionality 606a, move/resize element functionality 606b, modify primitive functionality 606c and modify dependencies functionality 606d. Add/remove element functionality 606a provides a user the ability to add or remove an element for a prototype. For example, a user may add or remove elements identified by flight procedure design configurations 104 such as coordinate points, line segments, arcs, locus of points, and boundary objects. Move/size element functionality 606b provides a user the ability to move or resize any of the elements identified by flight procedure design configurations 102. For example, a user may choose to move an element such as an arc to a different part of the generated prototype. Modify primitive functionality 606c provides a user the ability to modify a predefined element of flight procedure design configurations 102. Modify dependencies functionality 606d provides a user the ability to modify an element with a dependency resulting in an update of all dependencies of said element, as discussed previously.

According to an embodiment, view 602 includes hierarchical interface 642 which provides a visual representation to the user of element dependencies and any errors generated during the design of flight procedure criteria. Hierarchical interface 642 includes additional user actions 604b. User actions 604b include view dependencies functionality 612a which provides a user the ability to view construction step dependencies of a generated prototype. For example, hierarchical interface 642 may be a representation of the generated prototype as a tree with one or more construction step nodes. If a user highlights a node of the tree, all construction steps that may be impacted by the highlighted node may also be highlighted. According to an embodiment, user actions 604b include view error functionality 612b. View error functionality 612b provides a user the ability to view errors that may be introduced during the construction of a criteria prototype. Upon the modification of a prototype, an error may be discovered due to the dependencies between the functional elements. According to embodiments, view error functionality 612b may provide traceability of the error, highlighting the root cause of the error. This provides the user the ability to easily identify errors and debug the construction.

Figure 5:
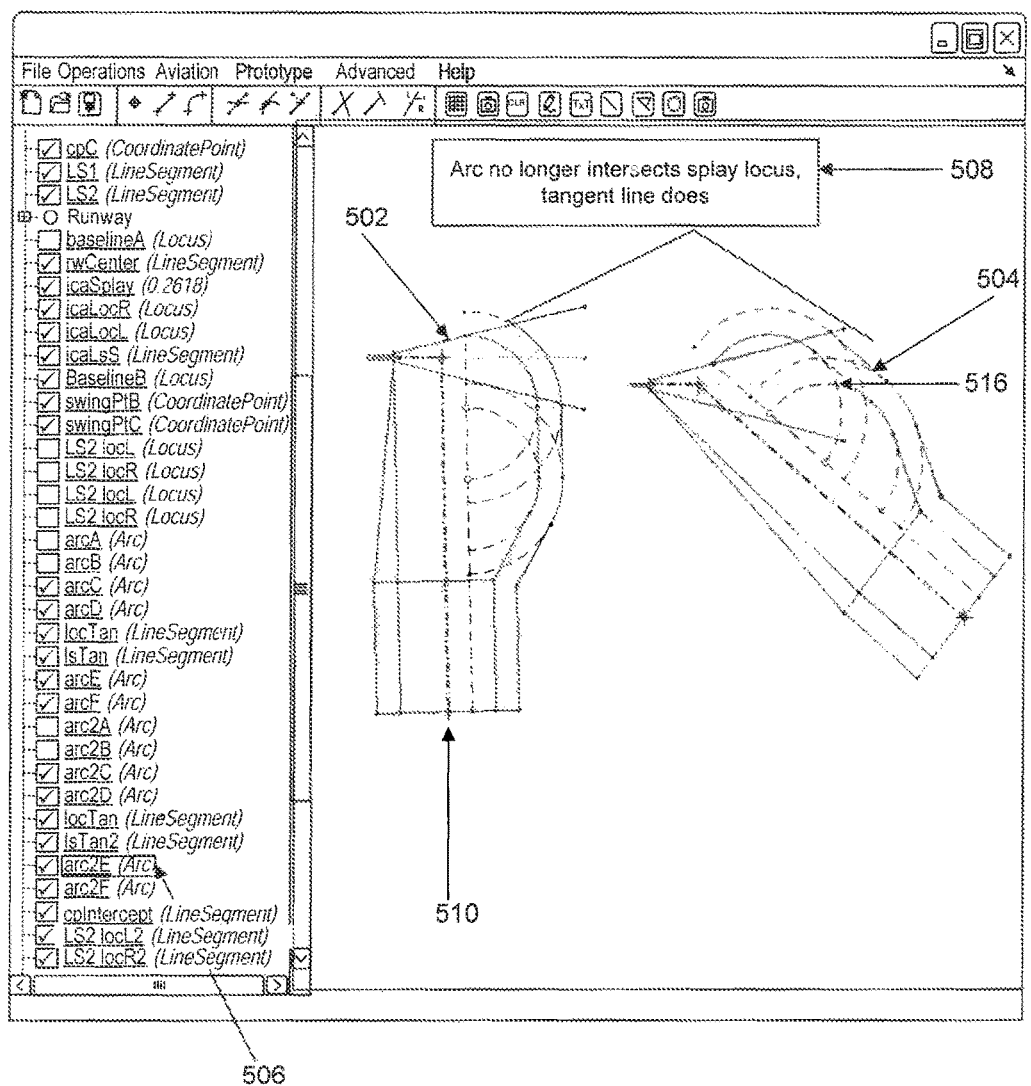
FIG. 5 illustrates another example screen shot of the flight procedure criteria tool, according to an embodiment.

FIG. 5 illustrates an example of the view error functionality. FIG. 5 represents an example of an error identification embodiment. In such a scenario, the user is evaluating two possible orientations for a particular Obstacle Evaluation Area construction, orientation 502 and orientation 504. The bottom most fix 510 of orientation 502 has been dragged such that the turn angle has been reduced and the tangent line connecting the outermost arcs now intersects the left splay locus 516. Thus, the truncated arc that was needed to complete the construction in the left scenario 502 can no longer be formed. The construction step corresponding to this arc may be highlighted to indicate where the error occurred, as shown with hierarchy tree node 506 in FIG. 5. All subsequent steps that would be impacted are disabled so the tool can continue to operate. The user should now be aware that this specific case was not accounted for and may require additional clarification in the criteria as shown by alert 508.

Returning to FIG. 6, according to embodiments, user actions 604a and 604b may generate events that are sent to controller 610 via view 602. Controller 610 handles the events from view 602 and converts the events into appropriate user actions that may be interpreted by model 626 and displayed in view 602. Controller 610 receives events based on user input and initiates a response by evaluating the impacted elements of model 626. For example, controller 610 accepts input from the user and instructs model 626 and view 602 to perform actions based on that input. Controller 610 is represented as a flow diagram to illustrate the steps taken upon receipt of any event.

At step 612, one or more user action events are received by controller 610. For example, the one or more user action events may be generated by user actions 604a and 604b of view 602. At step 614, model 626 is updated. For example, upon receipt of the one or more events from view 602, controller 610 may send instructions to model 626. The instructions may cause various elements of model 626 to update based on the kind of user action. An update of model 626 includes step 616. At step 616, the elements of the criteria prototype are evaluated based on the kind of user action received to determine if the design criteria are valid or invalid given the dependencies between the elements. If the design criteria are invalid, controller 610 is configured to display diagnostics of the evaluation at step 618 and highlight any errors found at step 620. Steps 618 and 620 generate events that are sent to view 602, to notify the user of the evaluation results. If the design criteria are valid, controller 610 is configured to generate events that will be sent to view 602 to update graphical interface 608 and hierarchical interface 642.

According to an embodiment, model 626 manages the data of model-view-controller pattern 600. Model 626 is configured to respond to requests for information about its state and responds to instructions to change state. According to an embodiment, model 626 may be a persistent storage mechanism such as a database, which stores both the data and the logic needed to manipulate the data in model-view-controller pattern 600. Prototype 628 includes one or more elements 630a ... 630n. Each of the elements 630a ... 630n includes logic and data to handle the element description 632, according to an embodiment. In another embodiment, each element 630a ... 630n handles the dependency relationships 634 between a parent element 638a and its descendant elements 638b. The visual representation of the model is handled by updates of construction primitives 636. Construction primitives may include many kinds of primitives, such as geometric primitives 640a, aviation primitives 640b, logic primitives 640c, and user defined primitives 640d. According to an embodiment, construction primitives 636 are linked to a mathematical library providing calculations for the construction primitives during updates.

Example Method Embodiments

Example methods according to embodiments of the present invention are now provided for the purpose of illustration. These example methods may be performed by the example system embodiments described above, and can be implemented using software, hardware, or a combination of software and hardware.

Figure 7:
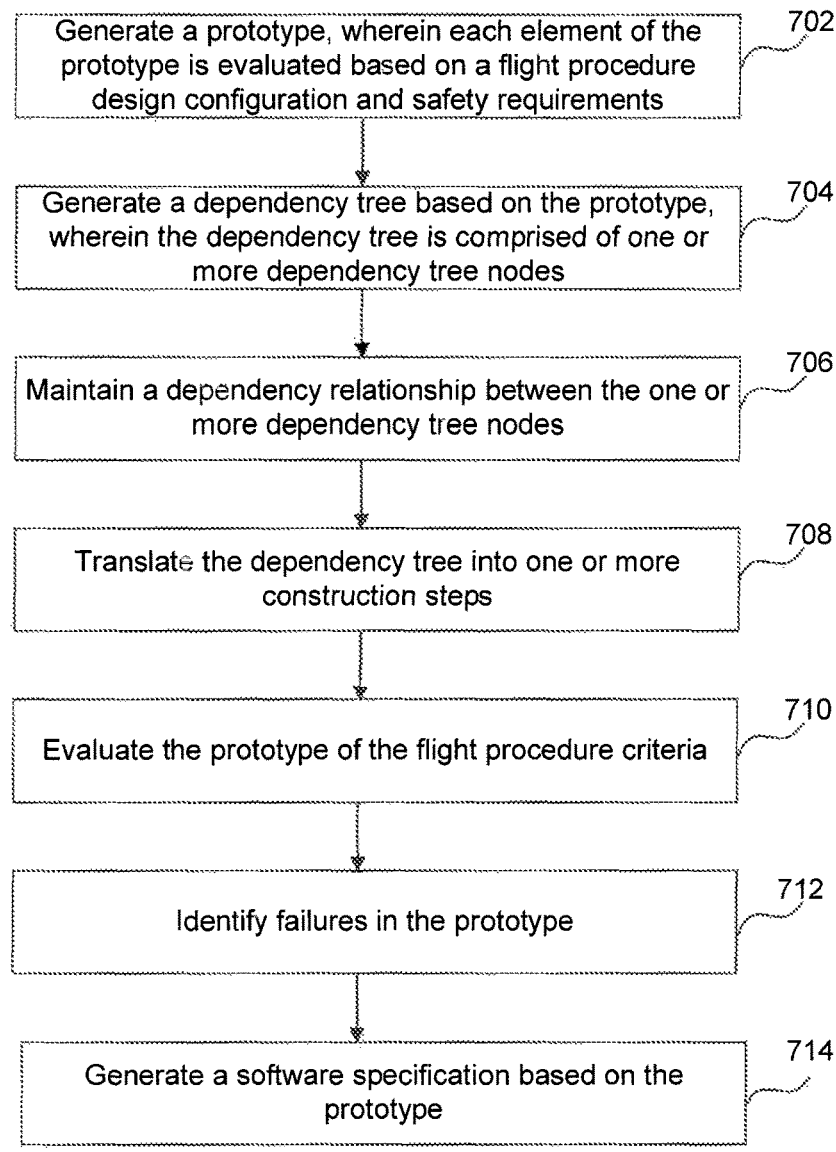
FIG. 7 is a process flowchart of a method for constructing flight procedure criteria, according to an embodiment.

FIG. 7 is a process flowchart 700 for constructing flight procedure criteria according to an embodiment of the present invention.

As shown in FIG. 7, process 700 begins at step 702, which includes generating a prototype. In an embodiment, each element of the prototype is evaluated based on one or more flight procedure configurations and one or more safety requirements. For example, step 702 includes accepting one or more primitive inputs, one or more flight procedure configurations, and one or more safety requirements, generating a visual representation of the one or more primitive inputs, and updating the visual representation of the one or more primitive inputs dynamically based on a change to the one or more primitive inputs. Each input may include a functional relationship with another input. Upon the addition or modification of an input, all of the successive functional relationships are tested, validated and updated as required by the safety requirements and the functional relationships. For example, step 702 may be performed by primitive constructing module 204 of flight procedure prototyping system 202.

In step 704, a dependency tree based on the prototype is generated, wherein the dependency tree is comprised of one or more dependency tree nodes. For example, step 704 may be performed by dependency tree module 208 of flight procedure prototyping system 202.

In step 706, a dependency relationship between the one or more dependency tree nodes is maintained. For example, step 706 may be performed by dependency tree module 208 of flight procedure prototyping system 202.

In step 708, the generated dependency tree is translated into one or more construction steps. In an embodiment, step 708 includes maintaining a relationship between the one or more dependency tree nodes and automatically updating the relationship when there is a change to the generated prototype. In another embodiment, step 708 includes identifying errors in the one or more construction methods. For example, step 708 may be performed by processor 206 of flight procedure prototyping system 202.

In step 710, the prototype is evaluated. For example, step 710 may be performed by primitive construction module 204 of flight procedure prototyping system 202. The evaluation of the prototype may be based on events generated by a user action, according to an embodiment. One or more events based on user input may be received and a response may be initiated by evaluating the impacted elements of the prototype. For example, upon receipt of the one or more events a set of instructions for processing may be generated. The instructions may cause various elements of the prototype to update based on the kind of user action. According to an embodiment, the elements of the criteria prototype are evaluated based on the kind of user action received to determine if the design criteria are valid or invalid given the dependencies between the elements. If the design criteria are invalid, diagnostics of the evaluation may be displayed and errors in the prototype may be highlighted.

In step 712, one or more failures in the prototype may be identified. For example, step 712 may be performed by primitive construction module 204 of flight procedure prototyping system 202. Each element of the prototype may maintain a functional relationship between all of its dependent elements. Upon a user action, such as the addition or modification of a predefined element or the addition of a new functional element, all of the successive functional relationships are tested, validated and updated as required by safety requirements and the functional relationships. According to an embodiment, in the event of an algorithmic failure of a flight procedure criteria, the user will be notified and decide if any of the elements require redesign or if the failure represents a procedure design constraint. As discussed previously, the user may be notified of such a failure by a highlight of the errors in the graphical representation of the prototype.

In step 714, one or more software specifications are generated based on the one or more construction steps. In an embodiment, step 714 includes navigating the dependency tree, generating one or more instruction steps based on the dependency tree, recording the one or more instructions steps and exporting the one or more instruction steps to an application or system. In another embodiment, step 714 includes generating one or more figures for each of the instruction steps, wherein the one or more figures show one or more inputs and one or more outputs for each of the instruction steps. For example, step 714 may be performed by processor 206 of flight procedure prototyping system 202.

Additional Features

Embodiments of this invention include interfacing with a geometric coordinate system. For example, flight procedure prototyping system 202 may interface with a geodetic coordinate system. A geodetic coordinate system may be used to translate positions to their real positions on earth. The design of flight procedure criteria involves geodetic calculations. These calculations may include operations on geodesic and non-geodesic curves. A geodesic curve is the shortest path between two points on the surface of the earth. A geodesic curve may be defined by either two geodetic points (start- and end-points) or by a start point, starting azimuth, and distance. A non-geodesic curve is any curve that is not the shortest path between two points. The use of a geodetic coordinate system with flight procedure prototyping system 202 allows for high precision calculations during the generation of prototypes.

In an embodiment, user interface 106 of flight procedure prototyping system 100 may be an interactive sketchpad. The interactive sketchpad allows for visual algorithm development and intuitive testing. Construction primitive inputs may be dragged and dropped onto the interactive sketchpad to generate a prototype. As elements of the generated prototype are selected, the corresponding hierarchical tree node may be highlighted. Upon modification, error traceability is allowed by indicating the root cause of any construction errors. For example, a hierarchical tree node may be highlighted indicating that the node is responsible for the construction error. This enables the simplification of debugging complicated flight procedure criteria constructions. In another embodiment, existing flight procedures may be imported into the system to analyze the impact of any criteria changes.

Example Computer System Implementation

Figure 8:
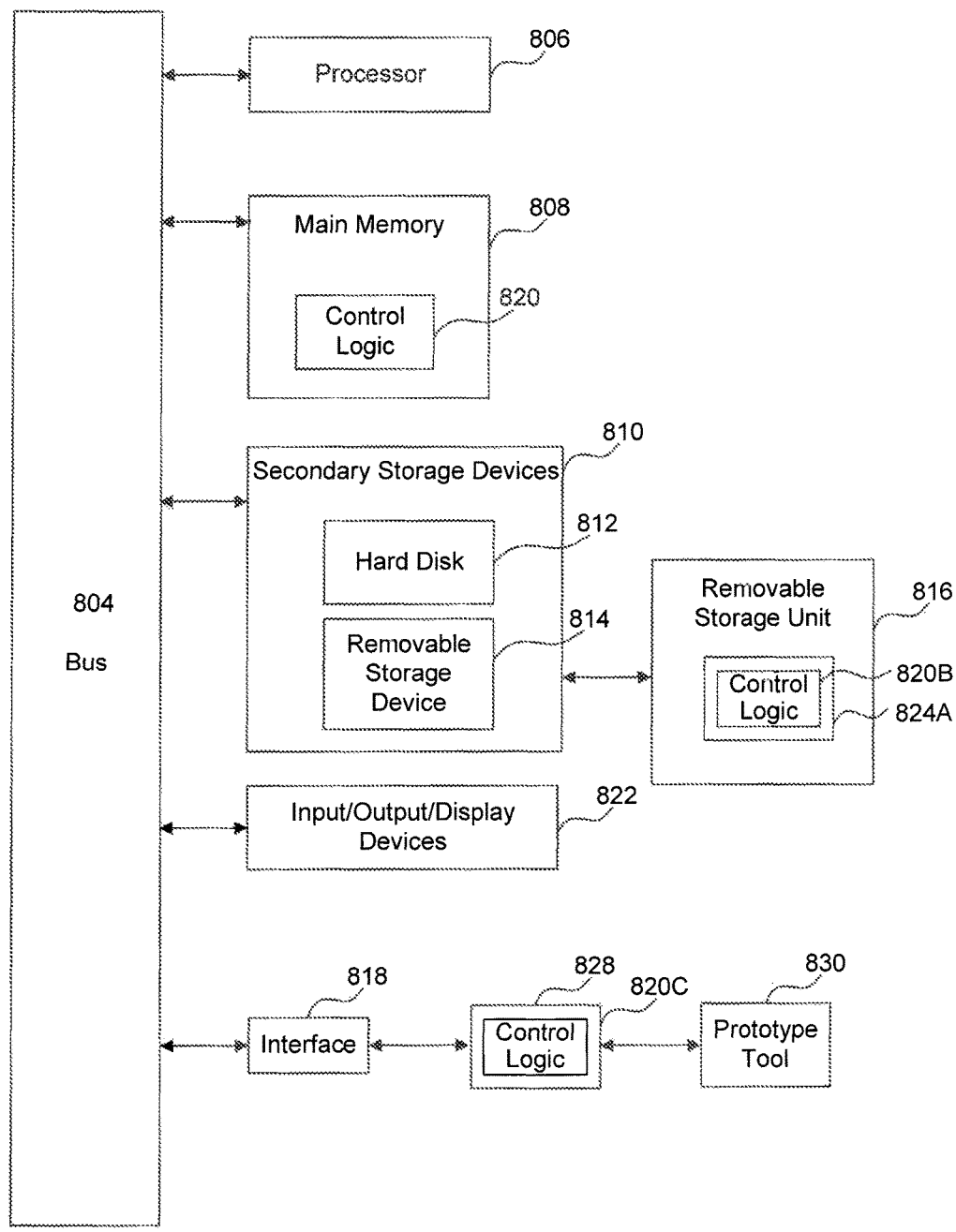
FIG. 8 is an example computer system capable of implementing embodiments of the present invention.

Various aspects of embodiments of the present invention can be implemented using software, firmware, hardware, or a combination thereof. FIG. 8 illustrates an example computer system 800 in which embodiments of the present invention, or portions thereof, can be implemented as computer-readable code. For example, the method illustrated by process 700 can be implemented in system 800. However, after reading this description, it will become apparent to a person skilled in the relevant art how to implement embodiments using other computer systems and/or computer architectures.

Computer system 800 includes one or more processors, such as processor 806. Processor 806 can be a special purpose or a general purpose processor. Processor 806 is connected to a communication infrastructure 804 (for example, a bus or network).

Computer system 800 also includes a main memory 808 (e.g., random access memory (RAM)) and secondary storage devices 810. Secondary storage devices 810 may include, for example, a hard disk drive 812, a removable storage drive 814, and/or a memory stick. Removable storage device 814 may comprise a floppy disk drive, a magnetic tape drive, an optical disk drive, a flash memory, or the like. Removable storage drive 814 reads from and/or writes to a removable storage unit 816 in a well-known manner. Removable storage unit 816 may comprise a floppy disk, magnetic tape, optical disk, etc. which is read by and written to by removable storage device 814. As will be appreciated by persons skilled in the relevant art(s), removable storage unit 816 includes a computer usable storage medium 824A having stored therein computer software and/or logic 820B.

Computer system 800 may also include a communications interface 818. Communications interface 818 allows software and data to be transferred between computer system 800 and external devices. Communications interface 818 may include a modem, a network interface (such as an Ethernet card), a communications port, a PCMCIA slot and card, or the like. Software and data transferred via communications interface 818 are in the form of signals which may be electronic, electromagnetic, optical, or other signals capable of being received by communications interface 818. These signals are provided to communications interface 818 via a communications path 828. Communications path 828 carries signals and may be implemented using wire or cable, fiber optics, a phone line, a cellular phone link, an RF link or other communications channels.

In this document, the terms "computer usable medium" and "computer readable medium" are used to generally refer to media such as removable storage unit and a hard disk installed in hard disk drive 812. Computer usable medium can also refer to memories, such as main memory 808 and secondary storage devices 810, which can be memory semiconductors (e.g. DRAMs, etc.).

Computer programs (also called computer control logic) are stored in main memory 808 and/or secondary storage devices 810. Computer programs may also be received via communications interface 818. Such computer programs, when executed, enable computer system 800 to implement embodiments of the present invention as discussed herein. In particular, the computer programs, when executed, enable processor 806 and Prototyping Application 830 to implement the processes of the present invention. Where embodiments are implemented using software, the software may be stored in a computer program product and loaded into computer system 800 using removable storage drive 814, interface 818, or hard drive 812.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A computer-implemented method for constructing flight procedure criteria, comprising:

generating, by a computing device, an adjustable prototype;

generating, by the computing device, a dependency tree based on the adjustable prototype, wherein the dependency tree is comprised of a plurality of dependency tree nodes;

identifying, by the computing device, one or more predefined elements based on a received flight configuration procedure;

modifying, by the computing device, the one or more predefined elements based on a received input;

maintaining, by the computing device, a plurality of functional elements represented by dependency relationships between the plurality of dependency tree nodes such that an output of a parent node is provided as an input to a descendant node of the parent node, wherein each functional element has a functional definition stored in a computational library and the functional element defines one or more criteria elements dependent on the modified one or more predefined elements associated with the dependency relationships between the parent node and the descendant node, wherein maintaining the plurality of dependency relationships comprises iteratively testing, validating and updating the plurality of dependency relationships between the plurality of dependency tree nodes when there is a change to a single portion of the generated adjustable prototype;

translating, by the computing device, the dependency tree into one or more construction steps, wherein there is a mapping between the one or more dependency tree nodes and the one or more construction steps; and generating, by the computing device, one or more flight procedure criteria specifications based on the one or more construction steps, wherein generating an adjustable prototype further comprises:

generating, by the computing device, a visual representation for the adjustable prototype; and updating, by the computing device, the visual representation of the adjustable prototype dynamically based on a change to the adjustable prototype.

2. The computer-implemented method of claim 1, wherein generating an adjustable prototype further comprises:

accepting, by the computing device, the one or more predefined elements, wherein the predefined elements represent flight construction primitives; and evaluating, by the computing device, each of the one of more predefined elements based on flight procedure configurations and safety requirements.

3. The computer-implemented method of claim 1, wherein generating an adjustable prototype further comprises:

interfacing with the computational library, wherein the computational library defines operations between the predefined elements and criteria elements of the adjustable prototype.

4. The computer-implemented method of claim 1, wherein translating the dependency tree into one or more construction steps further comprises:

identifying, by the computing device, failures in the one or more construction steps; and providing, by the computing device, one or more functions for resolving the identified failures.

5. The computer-implemented method of claim 1, wherein generating one or more software specifications based on the one or more construction steps further comprises:

traversing, by the computing device, the dependency tree;

generating, by the computing device, one or more instruction steps based on the dependency tree;

recording, by the computing device, the one or more instruction steps;

translating, by the computing device, the one or more instruction steps; and exporting, by the computing device, the one or more instruction steps to a program.

6. The method of claim 1, wherein the updating the plurality of dependency relationships between the plurality of dependency tree nodes further comprises:

traversing the dependency tree using a breadth-first traversal pattern.

7. The computer-implemented method of claim 1, wherein the one or predefined elements represent variables of the flight configuration procedure.

8. The computer-implemented method of claim 1, wherein the one or predefined elements include at least one of a geodetic point, a geodesic, an arc, a spiral, or a boundary object.

9. A non-transitory computer program product comprising a tangible computer useable hardware medium including control logic stored therein, the control logic when executed by one or more processors causing the processor to perform operations to construct flight procedure criteria, the operations comprising:

generating an adjustable prototype;

generating a dependency tree based on the adjustable prototype, wherein the dependency tree is comprised of one or more dependency tree nodes;

identifying one or more predefined elements based on a received flight configuration procedure;

modifying the one or more predefined elements based on a received input;

maintaining a plurality of functional elements represented by dependency relationships between the plurality of dependency tree nodes such that an output of a parent node is provided as an input to a descendant node of the parent node, wherein each functional element has a functional definition stored in a computational library and the functional element defines one or more criteria elements dependent on the modified one or more predefined elements associated with the dependency relationships between the parent node and the descendant node, wherein maintaining the plurality of dependency relationships comprises iteratively testing, validating and adjusting the plurality of dependency relationships between the plurality of dependency tree nodes when there is a change to a single portion of the generated adjustable prototype;

translating the dependency tree into one or more construction steps, wherein there is a mapping between the one or more dependency tree nodes and the one or more construction steps;

generating one or more flight procedure criteria specifications based on the one or more construction steps, wherein generating an adjustable prototype further comprises:

generating a visual representation for the adjustable prototype; and updating the visual representation of the adjustable prototype dynamically based on a change to the adjustable prototype.

10. The non-transitory computer program product of claim 9, wherein generating an adjustable prototype further comprises:

accepting the one or more predefined elements, wherein the predefined elements represent flight construction primitives; and evaluating each of the predefined elements based on flight procedure configurations and safety requirements.

11. The non-transitory computer program product of claim 9, wherein generating an adjustable prototype further comprises:

interfacing with the computational library, wherein the computational library defines operations between the predefined elements and criteria elements of the adjustable prototype.

12. The non-transitory computer program product of claim 9, wherein translating the dependency tree into one or more construction steps further comprises:

identifying failures in the one or more construction steps; and providing one or more functions for resolving the identified failures.

13. The non-transitory computer program product of claim 9, wherein generating one or more software specifications based on the one or more construction steps further comprises:
traversing the dependency tree;
generating one or more instruction steps based on the dependency tree;
recording the one or more instruction steps;
translating the one or more instruction steps; and
exporting the one or more instruction steps to another program.

14. A flight procedure criteria construction tool, comprising:
a primitive constructing module configured to generate an adjustable prototype;
a dependency tree module configured to identify one or more predefined elements based on a received flight configuration procedure, modify the one or more predefined elements based on a received input, and generate a dependency tree based on the adjustable prototype, wherein the dependency tree is comprised of one or more dependency tree nodes such that an output of a parent node is provided as an input to a descendant node of the parent node, wherein each functional element has a functional definition stored in a computational library and the functional element defines one or more criteria elements dependent on the modified one or more predefined elements associated with the dependency relationships between the parent node and the descendant node, maintain a plurality of functional elements represented by dependency relationships between the plurality of dependency tree nodes by iteratively testing, validating and updating the plurality of dependency relationships between the plurality of dependency tree nodes when there is a change to a single portion of the generated adjustable prototype;
a processor configured to translate the dependency tree into one or more construction steps, wherein there is a mapping between the one or more dependency tree nodes and the one or more construction steps, and to generate one or more flight procedure criteria specifications based on the one or more construction steps; and
a user interface configured to generate a visual representation of the adjustable prototype, and update the visual representation of the adjustable prototype dynamically based on a change to the adjustable prototype.

15. The flight procedure criteria construction tool of claim 14, wherein the primitive constructing module is further configured to the accept one or more predefined elements, wherein the predefined elements represent flight construction primitives, and evaluate each of the predefined elements based on flight procedure configurations and safety requirements.

16. The flight procedure criteria construction tool of claim 14, wherein the processor is further configured to identify failures in the one or more construction steps, and provide one or more functions for resolving the identified failures.

17. The flight procedure criteria construction tool of claim 14, wherein the processor is further configured to traverse through the dependency tree, generate one or more instruction steps based on the dependency tree, record the one or more instruction steps, translate the one or more instruction steps, and export the one or more instruction steps to a program.

18. A method of using a computer-aided design tool to create and validate instrument flight procedure criteria, comprising:
generating an adjustable prototype of the flight procedure criteria, the adjustable prototype including a plurality of construction primitives such that an output of a parent construction primitive is provided as an input to a descendant construction primitive of the parent construction primitive;
identifying one or more predefined elements based on a received flight configuration procedure;
evaluating the adjustable prototype of the flight procedure criteria based on a user action that modifies the adjustable prototype, the evaluating comprising modifying the one or more predefined elements based on the user action, maintaining a plurality of functional elements represented by functional relationships between the construction primitives of the adjustable prototype, wherein each functional element has a functional definition stored in a geodetic computational library and the functional element defines one or more criteria elements dependent on the modified one or more predefined elements associated with the dependency relationships between the parent node and the descendant node by testing, validating and updating a plurality of functional relationships between the construction primitives when a change to a single portion of the adjustable prototype is detected;
identifying failures in the adjustable prototype;
generating a flight procedure criteria specification based on the adjustable prototype; and
wherein generating an adjustable prototype further comprises:
generating, by the computing device, a visual representation for the adjustable prototype; and
updating, by the computing device, the visual representation of the adjustable prototype dynamically based on a change to the adjustable prototype.

19. The method of claim 18, wherein identifying failures in the adjustable prototype comprises:
providing a traceability of errors for the flight procedure criteria;
identifying one or more failure cases for the flight procedure criteria; and
identifying one or more design limitations for the flight procedure criteria.

20. The method of claim 18, wherein the evaluating the adjustable prototype of the flight procedure criteria comprises:
identifying one or more inputs from a user;
determining if the one or more inputs are defined; and
updating a dependency relationship for each of the one or more inputs.

21. The method of claim 18 further comprising:
interfacing with the geodetic computational library, wherein the geodetic computational library provides a set of calculations for the adjustable prototype of the flight procedure criteria.

22. The method of claim 18, further comprising:
designing a set of rules for an obstacles evaluation area; and
designing a set of rules for an obstacle clearance surface height.

23. The method of claim 18, wherein the generating a specification based on the adjustable prototype comprises:
converting the adjustable prototype into a textual and graphical representation; and exporting the textual and graphical representation to a program, wherein the program formats the textual and graphical representation of the adjustable prototype into a software specification document, the software specification document providing a description of the intended purpose and environment for development of the flight procedure criteria.

\* \* \* \* \*

UNITED STATES PATENT AND TRADEMARK OFFICE
CERTIFICATE OF CORRECTION

Page 1 of 1

PATENT NO. : 10,146,888 B2
APPLICATION NO. : 13/432615
DATED : December 4, 2018
INVENTOR(S) : Barnes et al.

It is certified that error appears in the above-identified patent and that said Letters Patent is hereby corrected as shown below:

In the Claims

In Column 13, Lines 29-30, please replace "the one of more predefined elements" with --the one or more predefined elements--.

In Column 13, Line 60, please replace "The method of claim 1" with --The computer-implemented method of claim 1--.

In Column 13, Line 66, please replace "the one or predefined elements" with --the one or more predefined elements--.

In Column 14, Line 2, please replace "the one or predefined elements" with --the one or more predefined elements--.

In Column 15, Lines 51-52, please replace "is further configured to the accept one or more predefined elements" with --is further configured to accept the one or more predefined elements--.

In Column 16, Line 54, please replace "The method of claim 18 further comprising" with --The method of claim 18, further comprising--.

Signed and Sealed this
Twenty-eighth Day of May, 2019

Andrei Iancu
*Director of the United States Patent and Trademark Office*